United States Patent
Daigo et al.

(10) Patent No.: US 11,626,331 B2
(45) Date of Patent: Apr. 11, 2023

(54) METHOD OF EVALUATING SILICON WAFER MANUFACTURING PROCESS AND METHOD OF MANUFACTURING SILICON WAFER

(71) Applicant: SUMCO CORPORATION, Tokyo (JP)

(72) Inventors: Shigeru Daigo, Saga (JP); Shuhei Matsuda, Saga (JP)

(73) Assignee: SUMCO CORPORATION, Tokyo (JP)

( * ) Notice: Subject to any disclaimer, the term of this patent is extended or adjusted under 35 U.S.C. 154(b) by 167 days.

(21) Appl. No.: 16/628,115

(22) PCT Filed: Jul. 2, 2018

(86) PCT No.: PCT/JP2018/024986
§ 371 (c)(1),
(2) Date: Jan. 2, 2020

(87) PCT Pub. No.: WO2019/017190
PCT Pub. Date: Jan. 24, 2019

(65) Prior Publication Data
US 2020/0365472 A1    Nov. 19, 2020

(30) Foreign Application Priority Data
Jul. 18, 2017 (JP) .............................. JP2017-138707

(51) Int. Cl.
*H01L 21/66* (2006.01)
*H01L 21/02* (2006.01)

(52) U.S. Cl.
CPC ........ *H01L 22/20* (2013.01); *H01L 21/02013* (2013.01)

(58) Field of Classification Search
CPC ... H01L 22/20; H01L 21/02013; H01L 21/02; H01L 22/24; H01L 22/26; H01L 22/10; G01N 22/00; G01N 21/9501
See application file for complete search history.

(56) References Cited

U.S. PATENT DOCUMENTS 3,919,639 A * 11/1975 Graff .................. G01R 31/2656
324/762.01
4,165,517 A * 8/1979 Temple ................. H01L 21/263
257/156
(Continued)

FOREIGN PATENT DOCUMENTS

BY         13719 C1 * 10/2010
CN    104620355 A      5/2015
(Continued)

OTHER PUBLICATIONS

International Search Report issued in International Patent Application No. PCT/JP2018/024986, dated Sep. 25, 2018; and English-language translation thereof.
(Continued)

*Primary Examiner* — Jarrett J Stark
(74) *Attorney, Agent, or Firm* — Greenblum & Bernstein, P.L.C.

(57) ABSTRACT

Provided is a method of evaluating a silicon wafer manufacturing process for mass-producing multiple silicon wafers. Lifetime measurement to silicon wafers mass-produced in the silicon wafer manufacturing process is performed in different locations within a surface of each of the silicon wafers and multiple measurement values are obtained. The representative value is determined for each of the silicon wafers from the multiple measurement values. The determination threshold is obtained for each wafer group including multiple silicon wafers using the representative value for each of the silicon wafers included in the wafer group. Whether the wafer group includes a silicon wafer having a lifetime outlier determined on the basis of the determination threshold among the multiple measurement values obtained for each of the silicon wafers is determined, (Continued)

and whether the manufacturing process may cause a defective product to be produced is determined.

8 Claims, 2 Drawing Sheets

(56) References Cited

U.S. PATENT DOCUMENTS

| | | | | |
|---|---|---|---|---|
| 5,254,300 | A * | 10/1993 | Priewasser | C30B 29/06 264/40.4 |
| 2005/0015736 | A1 | 1/2005 | Okuno | |
| 2008/0087643 | A1* | 4/2008 | Muller | H01L 21/67057 216/83 |
| 2011/0028293 | A1* | 2/2011 | Atkin | G06F 17/00 493/374 |
| 2014/0358271 | A1* | 12/2014 | Asakawa | G05B 19/41865 700/112 |
| 2015/0061711 | A1* | 3/2015 | Hamilton | G01R 31/2882 324/750.05 |
| 2015/0318222 | A1 | 11/2015 | Matsumoto et al. | |
| 2016/0359080 | A1* | 12/2016 | Chae | H01L 31/074 |

FOREIGN PATENT DOCUMENTS

| | | | |
|---|---|---|---|
| CN | 106463403 A | | 2/2017 |
| JP | H03276659 A | * | 12/1991 |
| JP | 5-129404 | | 5/1993 |
| JP | 2005-51210 | | 2/2005 |
| JP | 2005-301617 | | 10/2005 |
| JP | 2007-281331 A | | 10/2007 |
| JP | 2009-302246 | | 12/2009 |
| JP | 2013-197364 | | 9/2013 |
| JP | 2014-143325 | | 8/2014 |
| JP | 2014-165311 A | | 9/2014 |
| JP | 2015-32666 | | 2/2015 |
| JP | 2016-56050 | | 4/2016 |
| SU | 786796 A1 | * | 2/1982 |
| TW | I276188 | | 3/2007 |
| TW | 200845257 A | | 11/2008 |
| TW | 201430983 A | | 8/2014 |

OTHER PUBLICATIONS

Written Opinion of the International Searching Authority issued in International Application No. PCT/JP2018/024986, dated Sep. 25, 2018; and English-language translation thereof.

Taiwanese Office Action for corresponding Taiwanese Patent Application No. 107122903 dated May 21, 2019; and English-language translation thereof.

International Preliminary Report on Patentability for International Patent Application No. PCT/JP2018/024986, issued Jan. 21, 2020; and English-language translation thereof.

Office Action for DE App. No. 112018003661.8, dated Aug. 9, 2022 (w/ translation).

Office Action for CN App. No. 201880041858.9, dated Jan. 10, 2023 (w/ translation).

* cited by examiner

Fig. 2

METHOD OF EVALUATING SILICON WAFER MANUFACTURING PROCESS AND METHOD OF MANUFACTURING SILICON WAFER

CROSS-REFERENCE TO RELATED APPLICATIONS

This application claims the benefit of priority to Japanese Patent Application No. 2017-138707 filed on Jul. 18, 2017, which is expressly incorporated herein by reference in its entirety.

TECHNICAL FIELD

The present invention relates to a method of evaluating silicon wafer manufacturing process and a method of manufacturing a silicon wafer.

BACKGROUND ART

Lifetime measurement has been widely used as a method of evaluating a silicon wafer. Defects such as metal contamination (see, for example, Japanese Patent Application Publication No. 2014-143325, which is expressly incorporated herein by reference in its entirety), crystal defects and the like in a silicon wafer can be evaluated by the lifetime measurement.

SUMMARY OF INVENTION

Defects such as metal contamination, crystal defects and the like in a silicon wafer may be attributable to a process of manufacturing the silicon wafer. For example, if a metal sticks to a member included in a device for use in the manufacturing process, the silicon wafer may have metal contamination by contacting the member. The metal sticking to the wafer can be diffused within the crystal due to the subsequent thermal history. If crystal defects are introduced into a monocrystalline silicon ingot in the step of growing the ingot, silicon wafers cut out from the ingot have crystal defects. Such defects attributable to the manufacturing process may be detected by measuring the minority carrier lifetime (hereinafter simplify referred to as the "lifetime") in a silicon wafer produced in the manufacturing process. More specifically, defects such as metal contamination, crystal defects and the like reduce the lifetime measurement value, and therefore it can be determined that there is a defect attributable to the manufacturing process when the value is smaller than a value at which the product is expected not to include defects in an unacceptable level. In addition, it can be determined, on the basis of a determination result, that process maintenance work for the manufacturing process should be performed. If such determination is made, the process maintenance work is performed, so that non-defective silicon wafers having reduced defects can be stably mass-produced.

An aspect of the present invention provides for means for allowing a non-defective silicon wafer with reduced defects to be mass-produced with the use of lifetime measurement.

An aspect of the present invention relates to a method of evaluating a silicon wafer manufacturing process for mass-producing multiple silicon wafers (hereinafter referred to as the "method of evaluating the silicon wafer manufacturing process" or simply as the "evaluating method"), which includes:

performing lifetime measurement to silicon wafers mass-produced in the silicon wafer manufacturing process in different locations within a surface of each of the silicon wafers and obtaining multiple measurement values for each of the silicon wafers (hereinafter referred to as the "multiple measurement value obtaining step");

determining a representative value for each of the silicon wafers from the multiple measurement values (hereinafter referred to as the "representative value determining step");

obtaining, for the mass-produced silicon wafers, a determination threshold for each wafer group including multiple silicon wafers using the representative value for each of the silicon wafers included in the wafer group (hereinafter referred to as the "determination threshold determining step");

determining whether the wafer group includes a silicon wafer having a lifetime outlier determined on the basis of the determination threshold among the multiple measurement values obtained for each of the silicon wafers; and determining that;
  when no silicon wafer having the lifetime outlier is included, the manufacturing process allows a non-defective product to be produced;
  when a silicon wafer having the lifetime outlier is included, the manufacturing process may cause a defective product to be produced (hereinafter referred to as the "determining step").

In the above evaluating method, a determination threshold is obtained for each of wafer groups including multiple silicon wafers actually mass-produced in the manufacturing process as an evaluation target. Therefore, the necessity for predetermining a determination threshold can be eliminated. This can contribute to improve the efficiency in determination by eliminating the necessity for the step of performing various preliminary experiments for predetermining a determination threshold and for management of a number of determination thresholds and can also contribute to heighten the reliability in determination. Details are as follows.

The lifetime is affected by a resistance value (in other words, a dopant concentration) in addition to defects such as metal contamination, crystal defects and the like. Therefore, when a determination threshold is predetermined, highly reliable determination is unlikely unless a determination threshold is set for each of wafer product kinds with different resistance values. In contrast, in the above evaluating method, actually mass-produced silicon wafers are used to set a determination threshold in the manufacturing process as an evaluation target, and therefore highly reliable determination can be performed without predetermining a determination threshold.

Even if silicon wafers belong to the same product kind, they may have different resistance values. Therefore, the determination of the determination threshold using actually mass-produced silicon wafers may contribute to even higher reliability in determination.

By the above evaluating method according to an aspect of the present invention, whether to perform process maintenance work for the manufacturing process may be determined using the determination threshold.

In an embodiment, the above evaluating method may include determining that a cause of a defective product is included in processing performed to a silicon wafer having the lifetime outlier in the manufacturing process when it is determined that the manufacturing process may cause a defective product to be produced.

In an embodiment, the above evaluating method may include specifying a location with a lifetime outlier for the silicon wafer including the lifetime outlier. In that embodiment, the above evaluating method may further include determining, as a cause of a defective product, a member included in a device used for the processing performed to the silicon wafer including the lifetime outlier and considered to have contacted the specified location.

In an embodiment, a processing device determined to have the cause of the defective product may be polishing processing using a silicon wafer polishing apparatus.

In an embodiment, the representative value may be a median obtained from the multiple measurement values for each of the silicon wafers.

In an embodiment, the determination threshold may be a value obtained on the basis of the maximum value of the medians of the silicon wafers included in the wafer group.

A further aspect of the present invention relates to a silicon wafer manufacturing method (hereinafter also referred to as the "silicon wafer manufacturing method" or simply as the "manufacturing method"), which includes:

mass-producing silicon wafers in a silicon wafer manufacturing process for mass-producing multiple silicon wafers;

evaluating the manufacturing process by the above evaluating method; and further mass-producing silicon wafers in the manufacturing process when it is determined that the manufacturing process allows a non-defective product to be produced as the result of the evaluation; or further mass-producing silicon wafers in the manufacturing process after performing process maintenance work when it is determined that the manufacturing process may cause a defective product to be produced as the result of the evaluation.

According to an aspect of the invention, non-defective silicon wafers with reduced defects can be stably mass-produced.

BRIEF DESCRIPTION OF DRAWINGS

FIG. 2 shows a specific example of a result of lifetime mapping measurement.

DESCRIPTION OF EMBODIMENTS

Figure 1:
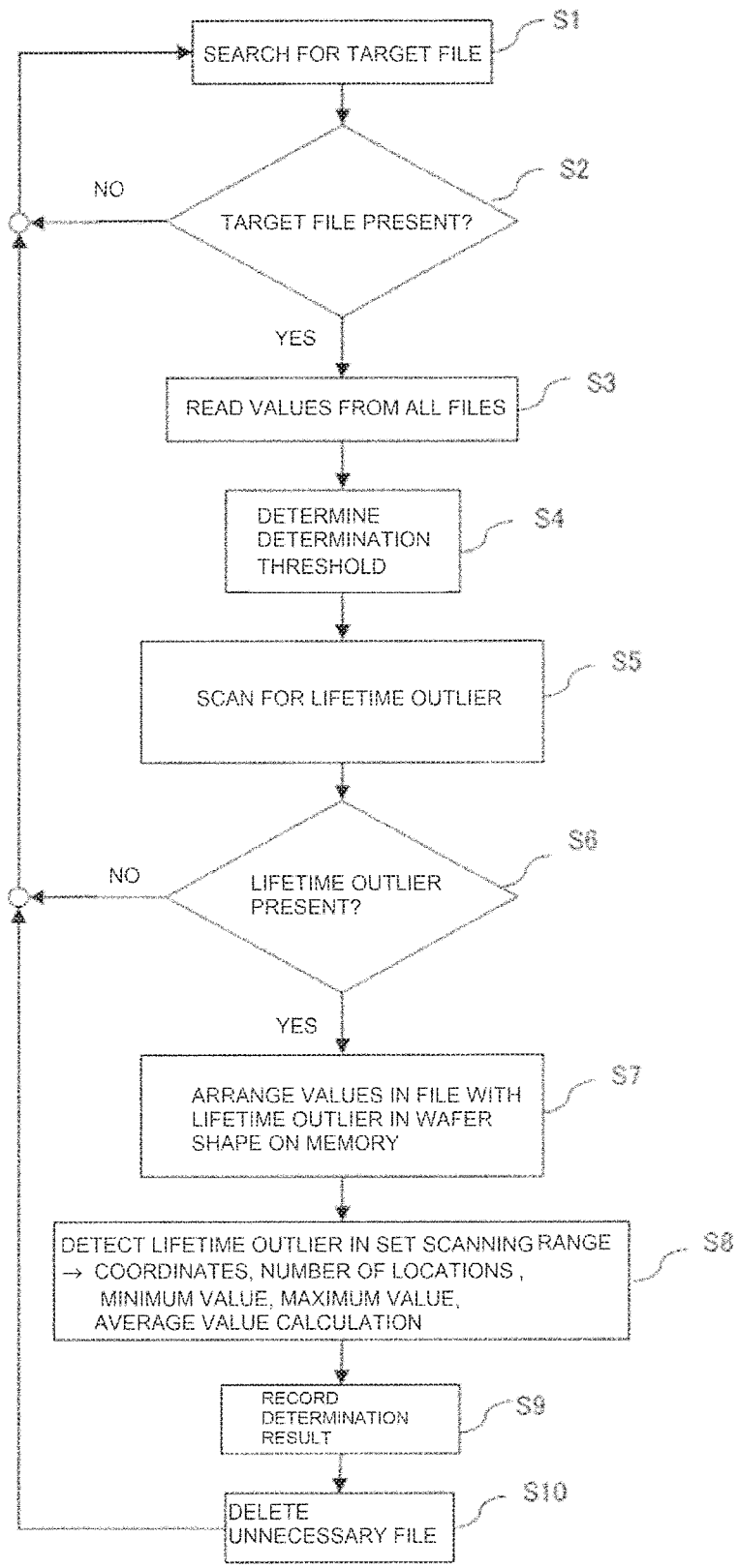
FIG. 1 is an exemplary determination flow which can be used in a method of manufacturing a silicon wafer according to an aspect of the present invention.

[Method of Evaluating Silicon Wafer Manufacturing Process]

An aspect of the present invention relates to a method of evaluating a silicon wafer manufacturing process for mass-producing multiple silicon wafers, which includes performing lifetime measurement to silicon wafers mass-produced in the silicon wafer manufacturing process in different locations within a surface of each of the silicon wafers and obtaining multiple measurement values for each of the silicon wafers; determining a representative value for each of the silicon wafers from the multiple measurement values; obtaining, for the mass-produced silicon wafers, a determination threshold for each wafer group including multiple silicon wafers using the representative value for each of the silicon wafers included in the wafer group; determining whether the wafer group includes a silicon wafer having a lifetime outlier determined on the basis of the determination threshold among the multiple measurement values obtained for each of the silicon wafers; and determining that: when no silicon wafer having the lifetime outlier is included, the manufacturing process allows a non-defective product to be produced; when a silicon wafer having the lifetime outlier is included, the manufacturing process may cause a defective product to be produced.

Hereinafter, the above evaluating method will be described more in detail. In the invention and in the specification, the silicon wafer will also be simply referred to as the "wafer".

<Manufacturing Process as Evaluation Target>

The manufacturing process as an evaluation target by the above evaluating method is a silicon wafer manufacturing process for mass-producing multiple silicon wafers. For example, the silicon wafer manufacturing process may include the step of cutting (slicing) wafers from a monocrystalline silicon ingot grown by the Czochralski (CZ) process, and the wafers obtained by the cutting are normally subjected to at least the steps of polishing and cleaning. The silicon wafer manufacturing process may further include various kinds of processing such as thermal treatment depending on what the mass-produced silicon wafers are to be used for. Examples of such thermal treatment may include vapor-phase growth (epitaxial growth), formation of a thermal oxide film, and annealing. However, the processing included in the manufacturing process as an evaluation target is not limited to those listed above, and various other kinds of known processing are included in the silicon wafer manufacturing process. In the invention and in the specification, the term "mass production" refers to manufacturing of multiple (two or more) silicon wafers, and the number of silicon wafers to be mass-produced may be 25 or more though not particularly limited.

<Multiple Measurement Value Obtaining Step>

In the above evaluating method, the silicon wafers, which have been mass-produced in the manufacturing process as an evaluation target, are each subjected to lifetime measurement in different locations within a surface. Therefore, multiple (that is, two or more) lifetime measurement values are obtained for each silicon wafer (multiple measurement values are obtained). For example, in the polishing processing, polishing may be performed while the back surface of a surface of a silicon wafer to be polished is held by a holding member. When, for example, a wafer is polished while one surface of the wafer is held using a chuck by a vacuum chuck system, the wafer surface held by the chuck in the polishing apparatus contacts the chuck and may be contaminated by the metal. For example, in order to stably mass-produce non-defective silicon wafers with reduced defects attributable to the metal contamination, lifetime measurement is preferably performed at least in different locations within a surface. When, for example, a silicon wafer is placed on a wafer placement member such as a susceptor or a wafer boat and thermally treated, lifetime measurement is preferably performed in different locations within the wafer surface in contact with the wafer placement member. This is for the purpose of stably mass-producing non-defective silicon wafers with reduced defects attributable to metal contamination caused by contact with the wafer placement member (for example, contact with a lift pin).

A lifetime measuring device normally has a mapping measuring function. By the mapping measurement, measurement can be performed at a fixed pitch within the surface for measurement, and a measurement result including positional information (such as position coordinates) and measurement values in association with each other can be obtained. The lifetime measurement by the above evaluating method is preferably performed by such mapping measurement. In this way, multiple measurement values can be obtained in various locations within a surface in each of the silicon wafers. The number of measurement values obtained by the lifetime measurement is multiple (that is, two or more) and may be set, for example, in consideration of the wafer diameter. As for a silicon wafer having a diameter from 200 mm to 450 mm, lifetime measurement values may be obtained in about 50 to 200 locations within one surface of the wafer. In an embodiment, the measurement value is available as a recombination lifetime value obtained by the lifetime measuring device. In another embodiment, when a measurement result is available in the form of an image file, a measurement value by the lifetime measurement may be obtained as a numerical value obtained by converting the color intensity of the image. The lifetime measurement can be performed according to a known method, and a commercially available measuring device or a measuring device based on a known measurement principle can be used. In viewpoint of the ease of mapping measurement, the lifetime measuring device is preferably a measuring device according to the μ-PCD method (Microwave Photo Conductivity Decay). In addition, thermal treatment may be performed as required according to a known method before measurement. The thermal treatment allows a metal sticking to the wafer to be diffused within the wafer. The thermal treatment when carried out in an oxidizing atmosphere allows an oxide film to form on the wafer. The formation of the oxide film may effectively passivate the wafer surface (reduce the effect of the diffused component from the surface on the lifetime values).

<Representative Value Determining Step>

Multiple measurement values are obtained for each of the silicon wafers by the lifetime measurement performed in the multiple measurement value obtaining step. A representative value for each of the silicon wafers is obtained from the obtained multiple measurement values. The representative value is used in the succeeding determination threshold determining step.

The representative value may be a median, a maximum value, a minimum value, or an average value (such as an arithmetic mean). In an embodiment, all the multiple measurement values obtained for each of silicon wafers may be used for determining a representative value for the silicon wafer. In another embodiment, a representative value may be determined using some of the multiple measurement values obtained for each of the silicon wafers while excluding part of the other measurement values. For example, measurement values obtained in an outer peripheral region with a prescribed width (an outer peripheral region) may be excluded from the measurement values obtained by performing mapping measurement in the entire region of a surface of each of the silicon wafers, and a representative value may be determined using the other measurement values. The prescribed width may be from 3 mm to 10 mm. Alternatively, measurement values obtained in a wafer center region of each of the silicon wafers may be excluded, and a representative value may be determined using the other measurement values. The wafer center region may be a region with a radius from 147 mm to 140 mm from the center of the wafer. In addition, measurement values obtained in an outer peripheral region and a wafer center region may be excluded, and a representative value may be determined using the other measurement values. In an embodiment, in the multiple measurement value obtaining step, lifetime measurement may be performed while excluding a partial region (such as an outer peripheral region and/or a wafer center region) of each of the silicon wafers from the target for lifetime measurement, and measurement values by the lifetime measurement may be obtained in multiple locations other than the partial region. In this way, the exclusion of measurement values in a partial region or excluding a partial region from the target region of the lifetime measurement may contribute to improved evaluation efficiency and/or improved reliability. Details are as follows.

For example, when polishing processing is performed while one surface of a wafer is held, metal contamination if any at a holding member may lead to metal contamination in a location where the wafer contacts the contaminated holding member. Meanwhile, an outer peripheral region of a silicon wafer is prone to metal contamination for causes other than the contact with the holding member during polishing processing because the outer peripheral region is more likely to contact members in various steps. Therefore, in order to determine whether to perform process maintenance work for polishing processing in particular, measurement values in the outer peripheral region may be excluded or the peripheral region may be excluded from the target for lifetime measurement for the purpose of selectively detecting metal contamination caused by the polishing processing, so that the evaluation can be carried out efficiently. Furthermore, the reliability in evaluating the presence/absence of metal contamination attributable to contact with the holding member can be improved.

In addition, in many cases, the wafer center region does not include a location in contact with the holding member and is apart from any location in contact with the holding member. Measurement values in such a region unlikely to have metal contamination attributable to contact with the holding member may be excluded or such a partial region may be excluded from the target region for lifetime measurement, so that the evaluation can be carried out efficiently and/or improved reliability can be provided.

The above embodiments are illustrative. The step can be applied not only to polishing processing but also to any processing to which whether to perform process maintenance work should be particularly determined. Evaluation can be efficiently performed and/or reliability can be improved by excluding a measurement value in a partial region or excluding a partial region from the target region of the lifetime measurement in accordance with the processing.

<Determination Threshold Determining Step>

In the representative value determining step, a representative value is determined for each of multiple silicon wafers mass-produced in the silicon wafer manufacturing process as an evaluation target.

Then, in the determination threshold determining step, a determination threshold for determination in the following determining step is obtained using a representative value for each of silicon wafers included in each of wafer groups each including multiple silicon wafers. The wafer group for which a determination threshold is obtained may include multiple silicon wafers which belong to the same product kind or different kinds, and the wafer group preferably includes multiple wafers which belong to the same product kind, in view point of improvement in evaluation reliability. The number of the silicon wafers included in one wafer group may be from 2 to 25 though not particularly specified. In the invention and in the specification, the wording "multiple silicon wafers which belong to the same product kind" refers to multiple silicon wafers manufactured under the same manufacturing condition in the same manufacturing facility. However, the same manufacturing facility may include different members for performing the same processing. For example, the polishing apparatus may include multiple polishing heads. In this case, silicon wafers processed using different polishing heads of the same polishing apparatus are referred to as multiple silicon wafers which belong to the same product kind if the wafers are manufactured under the same condition in the same facility. As for the term "the same manufacturing condition," unintended fluctuations in the manufacturing condition are allowed. For example, a processing liquid mixed as a processing liquid having the same composition may have a slightly different composition because of unintended errors during mixing or may change over time.

The wafer group for which a determination threshold is obtained includes multiple silicon wafers, and a representative value has been determined in the representative value step determining for each of the silicon wafers. Using the representative values, a determination threshold is determined for the wafer group. The determination threshold may be determined, for example, on the basis of the maximum value, the minimum value, and the average value (such as an arithmetic mean) of the representative values of the multiple silicon wafers included in the wafer group for which the determination threshold is determined. In the following, the maximum value, the minimum value, or the average value of the representative values of the silicon wafers included in the wafer group for which the determination threshold is determined will be referred to as the "reference value." The determination threshold may be the reference value itself or may be a value calculated using the reference value. For example, the determination reference value can be obtained by "reference value−a" or "reference value+a." Here, "a" may be any numerical value and may be determined empirically or by experiments performed in advance in order to prevent generation of a defective product having a defect in an unacceptable level (such as metal contamination, crystal defects and the like) for the product. The level of defect included in the defective product is not particularly limited and can be set according to the quality required for the product (non-defective product).

As described above, the determination threshold can be determined for each of the wafer groups including the silicon wafers actually mass-produced in the manufacturing process as an evaluation target, so that it becomes no longer necessary to predetermine a determination threshold. Therefore, the necessity for data management for determination thresholds can also be eliminated. Even among multiple silicon wafers which belong to the same product kind, the resistance value may slightly vary among ingots from which these wafers are cut out or even among wafers cut out from the same ingot. As described above, the resistance value affects the lifetime, determining a determination threshold for each of wafer groups including silicon wafers that are actually mass-produced can contribute to higher determination reliability based on lifetime measurement rather than determining one determination threshold for each of product kinds without considering the slight difference in the resistance value which may occur in the same product kind, <Determining Step>

In the above determination threshold determining step, the determination threshold is determined for a wafer group including multiple silicon wafers mass-produced in the manufacturing process as an evaluation target.

Then, in the determining step, using the determination threshold, it is determined whether a lifetime outlier is included in the multiple measurement values obtained in the multiple measurement value obtaining step for each of the silicon wafers included in the wafer group for which the determination threshold is determined. For example, a measurement value equal to or less than the determination threshold or a measurement value less than the determination threshold can be detected as a lifetime outlier. Then, if the wafer group for which the determination threshold has determined does not include any silicon wafer having one or more lifetime outliers in the multiple measurement values, it can be determined that the manufacturing process for the mass-produced silicon wafers included in the wafer group is a manufacturing process which allows non-defective products to be produced. Meanwhile, if the wafer group for which the determination threshold has been determined includes at least one silicon wafer having one or more lifetime outliers in the multiple measurement values, it can be determined that the manufacturing process for the mass-produced silicon wafers included in the wafer group is a manufacturing process which may cause a defective product to be produced.

As in the foregoing, it can be determined whether the silicon wafer manufacturing process as an evaluation target may produce a defective product, that is, a silicon wafer with a defect in a level (such as metal contamination, crystal defects and the like) unacceptable for the product, <Determining Cause of Defective Product>

In an embodiment of the above evaluating method, when it is determined that the silicon wafer manufacturing process as an evaluation target is a manufacturing process that may cause a defective product to be produced, it can be determined that the processing performed on the silicon wafer having the lifetime author in the multiple measurement values obtained in the multiple measurement value obtaining step may be a cause of the defective product. For example, when polishing processing using a polishing apparatus including multiple polishing heads is included in the manufacturing process as an evaluation target, it can be determined that a holding member, which has held the silicon wafer in the polishing process of the silicon wafer, which has been then determined to include a lifetime outlier, using one of the polishing heads, is a cause of the defective product (such as a cause of metal contamination).

In a further embodiment, a location with a lifetime outlier can be specified for a silicon wafer including the lifetime outlier in the multiple measurement values obtained in the multiple measurement value obtaining step. For example, when the lifetime measurement is carried out in the multiple measurement value obtaining step by mapping measurement, a measurement result includes positional information on measurement locations and measurement values in association with each other, and therefore the location with the lifetime outlier can be specified using the measurement result. When the location with the lifetime outlier is specified, the member considered to have contacted the specified location can be determined as the cause of the defective product. For example, during polishing in the polishing apparatus, two or more holding members may be used to hold one surface of the silicon wafer (the back surface of the surface to be polished) in two or more locations. In this case, among the two or more holding members, the holding member that has held the location specified as the location with the lifetime outlier can be determined as the cause of the defective product. Alternatively, when the location with the lifetime outlier exists in the entire region of the surface of the silicon wafer, a cleaning solution used for cleaning the entire surface of the silicon wafer in the cleaning step or the atmosphere of the thermal treatment furnace can be determined as the cause of the defective product.

By the above evaluating method according to an aspect of the present invention, whether the silicon wafer manufacturing process as an evaluation target may cause a defective product to be produced can be determined. Furthermore, when it is determined that a defective product may be produced, which step or which device or member used in the manufacturing process may cause a defective product to be produced can be determined. The determination result thus obtained can be used to determine whether to perform process maintenance work for the silicon wafer manufacturing process.

[Method of Manufacturing Silicon Wafer]

A further aspect of the present invention relates to a method of manufacturing a silicon wafer, which includes mass-producing silicon wafers in a silicon wafer manufacturing process for mass-producing multiple silicon wafers, evaluating the manufacturing process by the evaluating method according to an aspect of the present invention, further mass-producing silicon wafers in the manufacturing process when it is determined the manufacturing process allows a non-defective product to be produced as a result of evaluation, or further mass-producing silicon wafers in the manufacturing process after performing process maintenance work when it is determined that the manufacturing process may cause a defective product to be produced as a result of evaluation.

The steps from the mass-production of multiple silicon wafers to the determination are as described above. When it is determined that the manufacturing process allows a non-defective product to be produced as a result of evaluation by the evaluating method according to an aspect of the present invention, silicon wafers can continue to be manufactured in the same manufacturing process without performing process maintenance work. Meanwhile, when it is determined that the manufacturing process may cause a defective product to be produced as a result of evaluation, silicon wafers can be mass-produced in the manufacturing process after performing process maintenance work in order to eliminate the cause of the defective product or reduce the degree of defectiveness. In this way, non-defective silicon wafers can be stably mass-produced, so that the occurrence of defective products can be reduced.

The process maintenance work refers to execution of at least one selected from the group consisting of replacement of a member in a device, repair of a member, cleaning of a member, and replacement of an agent in the manufacturing process. For example, degradation of a member or an agent may cause a silicon wafer manufactured in a silicon wafer manufacturing process to have a defect which leads to a lifetime outlier. Meanwhile, the process maintenance work can be performed to reduce the occurrence of defects on the surfaces of silicon wafers manufactured in the silicon wafer manufacturing process. However, it is not easy or inefficient to determine whether to perform process maintenance work without referring to any index. In contrast, in the silicon wafer manufacturing method according to an aspect of the present invention, whether to perform process maintenance work in the silicon wafer manufacturing process can be determined using the evaluating method according to an aspect of the present invention. That is, whether to perform the process maintenance work can be determined referring to a result of evaluation carried out by the evaluating method according to an aspect of the present invention as an index.

When it is determined, as a result of the evaluation, that the manufacturing process may cause a defective product to be produced, the process maintenance work for the silicon wafer manufacturing process is performed. The process maintenance work is as described above. When, for example, the process maintenance work for the polishing processing is performed in the manufacturing process for polished wafers, specific examples of the process maintenance work may include replacement of a holding member, cleaning of the holding member, replacement of a polishing fabric, and replacement of slurry including abrasive grains in the polishing apparatus. As for the manufacturing process including thermal treatment, specific examples of the process maintenance work may include replacement and cleaning of any of members (such as lift pin) which constitute a wafer placement member such as a susceptor and a wafer boat and cleaning of the wafer placement surface of the member. As for the manufacturing process including cleaning processing, specific examples of the process maintenance work may include replacement of a cleaning agent.

Lifetime measurement to a silicon wafer can be performed as quality inspection before shipment. In the above manufacturing method, whether to perform the process maintenance management for the manufacturing process can be determined using the result of the quality inspection without performing separate measurement for determining the necessity of the process maintenance work for the manufacturing process.

<Specific Example of Method of Manufacturing Silicon Wafer>

A specific example of the method of manufacturing a silicon wafer will be described in conjunction with the drawings. However, the following specific example is for the purpose of illustration only and not intended to limit the present invention.

FIG. 1 is a flowchart for illustrating a general outline of a determination flow.

In the specific example, software having the determination flow programmed therein is used. The number of silicon wafers which form a wafer group for which a determination threshold is obtained (hereinafter as the "set number") is set in the software. In the example, the silicon wafer manufacturing process as an evaluation target includes at least polishing processing for polishing a silicon wafer (having a diameter of 300 mm), cut out from a monocrystalline silicon ingot, using a polishing apparatus and cleaning processing. The polishing apparatus includes multiple polishing heads, and a silicon wafer polished by each of the polishing heads has its back surface of the surface to be polished held by multiple chucks.

In the silicon wafer manufacturing process as an evaluation target, multiple silicon wafers which belong to the same product kind (hereinafter referred to as the "product kind A") are mass-produced for a prescribed period, and the multiple silicon wafers which belong to another one of the same product kind (hereinafter referred to as the "product kind B") are mass-produced for a prescribed period. The mass-produced silicon wafers are subjected to lifetime measurement after the completion of the manufacturing process. The lifetime measurement is mapping measurement at the surface held by the chucks in the polishing step. The evaluation result obtained by the mapping measurement is stored as one electronic file for one silicon wafer. Therefore, when silicon wafers continue to be mass-produced and then subjected to lifetime measurement, multiple electronic files are stored. In the specific example, the measurement value is a recombination lifetime value measured by the μ-PCD method after an oxide film is formed on the surface by thermal oxidation. The electronic file includes step history information on the silicon wafer. For example, the file includes information on which polishing head among the multiple polishing heads was used in the polishing apparatus in the silicon wafer polishing step.

The software continuously allows the folder storing the electronic files to be monitored, so that storing of an electronic file is detected. Upon detecting storing of multiple electronic files, the software allows an electronic file for an evaluation result of a silicon wafer which belongs to one of the product kinds (the product kind A or B) to be searched (S1).

When it is determined that the number of electronic files for the evaluation results of silicon wafers which belong to the product kind A is not less than the set number as a result of the target file search (S2), the measurement values in all the files as many as the set number are read into the software (S3).

In an embodiment, a reference value can be calculated using all the measurement values in all the files. In another embodiment, a representative value can be calculated while some of the measurement values are excluded from all the files. For example, the latter case can be conducted as follows.

All the measurement values stored in all the electronic files are read into the software, and all the measurement values stored in an electronic file for one silicon wafer are arranged in a wafer shape on the memory (on the screen) using a measurement result including, in association with each other, positional information on measurement locations and measurement values obtained by mapping measurement. The measurement values in a region having a radius of 145 mm from the center of the wafer shape (a circular region) is used for obtaining a representative value. Since the diameter of the silicon wafer for which the lifetime measurement has been performed is 300 mm, the measurement values arranged in a region (an outer peripheral region) having a width of 5 mm at the outer periphery of the wafer shape are not used for obtaining the representative value. As a representative value, a median is obtained in the specific example. The median of each of the silicon wafers is determined by calculating the median in the same manner as the above for all the files read into the software.

Then, a reference value is determined from the medians obtained for all the files read into the software. The reference value can be a maximum value, a minimum value, or an average value as described above. In this specific example, the maximum value of the medians is determined as the reference value. Using the reference value set in this way, "reference value–a" is determined as a determination threshold. In the specific example, the reference value is a value determined from a recombination lifetime value, and "a" is empirically set in the range from 200 µs to 400 µs.

In this way, the determination threshold is determined (S4).

Then, all the electronic files read into the software are searched scanned for a lifetime outlier which matches the condition on the basis of the determination threshold (S5). The lifetime outlier which matches the condition may be a value equal to or less than the determination threshold or a value less than the determination threshold. In the specific example, the scanning for a lifetime outlier is performed while excluding the measurement values arranged in the outer peripheral region. That is, the set scanning range is scanned for a lifetime outlier. The presence/absence of a lifetime outlier is checked (S6), and when a lifetime outlier is detected, various kinds of information are obtained using the measurement result including, in association with each other, the positional information on the measurement locations and the measurement values in the electronic file having the lifetime outlier. In this case, all the measurement values stored in the electronic file having the lifetime outlier can be arranged in a wafer shape on the memory (on the screen) (S7). Examples of the various kinds of information may include the position (such as position coordinates) of the location with the lifetime outlier, the number of such locations, and the minimum value, the maximum value, and the average value of the lifetime outliers when multiple lifetime outliers are detected from one electronic file. These kinds of information are recorded as a determination result, for example, in a storage device (S9). The electronic file used to determine the representative value may be deleted as an unnecessary file (S10). In addition, when a lifetime outlier is detected, the detection may be output from the software as a signal and received by a signal receiver, so that the receiver may transmit a stop command signal to a device used in the manufacturing process. For example, a stop command signal may be transmitted to the polishing apparatus, and the polishing apparatus can be stopped. Then, the polishing apparatus may be subjected to process maintenance management after being stopped.

The above determination flow can be performed to one or more other wafer groups which belong to the product kind A and can also be performed to one or more wafer groups which belong to the product kind B.

Figure 2:
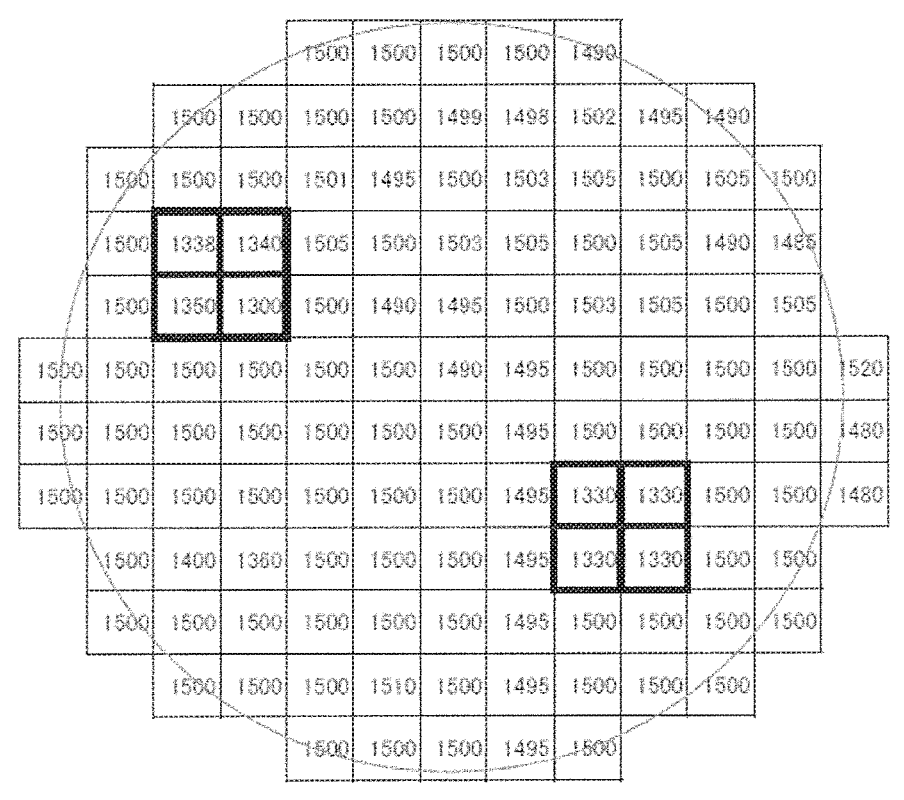

FIG. 2 shows a specific example of the mapping diagram (a specific example of a measurement result of lifetime mapping) in which all measurement values in an electronic file determined to have a lifetime outlier are arranged in a wafer shape on the memory, and the values shown in eight locations in bold frames are lifetime outliers. In the specific example, since the locations with the lifetime outliers shown in FIG. 2 are in positions where the wafer was held by the chucks during polishing or their peripheries, the chucks provided opposed to the polishing heads used for polishing the silicon wafer can be determined as a cause of the defective product. For example, the chucks can be determined as the cause of metal contamination of the silicon wafer. After the determination, process maintenance work such as replacement of the chucks determined as the cause of the defective product, cleaning and the like may be performed. In addition, the level of defect occurrence can be evaluated on the basis of various kinds of information such as the number of locations with lifetime outliers, the minimum value, the maximum value, and the average value of the multiple lifetime outliers, and details of process maintenance work can be determined on the basis of the evaluation result. For example, as the number of the locations is greater or as the minimum value, the maximum value, and the average value are greater, it can be evaluated that the degree of defect occurrence is high. If the level of defect occurrence is evaluated as high, the chucks may be replaced, and if the level of defect occurrence is evaluated as low, the chucks may be cleaned without replacement as process maintenance management. The mass production of silicon wafers can be resumed in the manufacturing process after the process maintenance work, silicon wafers with reduced occurrence of defects which are attributable to contact with the chucks (such as caused by metal contamination) can be stably mass-produced.

In the above description, the polishing processing, more specifically, the polishing apparatus used in the polishing processing is a main cause of the defective product by way of illustration, but this is not intended to limit the present invention.

An aspect of the present invention is useful in the field of silicon wafer manufacturing.

The invention claimed is:

1. A method of evaluating a silicon wafer manufacturing process for mass-producing multiple silicon wafers,
   wherein the silicon wafer manufacturing process for mass-producing multiple silicon wafers comprises polishing each silicon wafer to be mass-produced, wherein during the polishing, among two surfaces of each silicon wafer, one of the surfaces is polished and the other surface is held by chucks of a silicon wafer polishing apparatus,
   the method of evaluating the silicon wafer manufacturing process for mass-producing multiple silicon wafers comprising:
      forming an oxide film by thermal oxidation on the surface held by the chucks during the polishing;
      performing lifetime measurement on the surface of the oxide film of the silicon wafers mass-produced in the silicon wafer manufacturing process in different locations within the surface of the oxide film of each of the mass-produced silicon wafers and obtaining multiple lifetime measurement values for each of the mass-produced silicon wafers;
      determining a representative lifetime measurement value for each of the mass-produced silicon wafers from the multiple lifetime measurement values obtained for that wafer;
      obtaining, for a wafer group containing a plurality of the mass-produced silicon wafers, a lifetime measurement determination threshold using the lifetime measurement representative value determined for each of the mass-produced silicon wafers included in the wafer group;
      determining whether the wafer group comprises a silicon wafer having a lifetime outlier determined on the basis of the lifetime measurement determination threshold obtained for the wafer group among the multiple measurement values obtained for each of the silicon wafers in the wafer group; and
      determining that:
         when no silicon wafer having the lifetime outlier is included in the wafer group, the manufacturing process allows a non-defective product to be produced;
         when a silicon wafer having the lifetime outlier is included in the wafer group, the manufacturing process may cause a defective product to be produced,
      the evaluating method further comprises determining that a cause of a defective product is included in the polishing when it is determined that the manufacturing process may cause a defective product to be produced.

2. The method of evaluating according to claim 1,
   which comprises specifying a location with a lifetime outlier for the silicon wafer including the lifetime outlier, and
   further comprises determining, as a cause of a defective product, the chucks included in the polishing apparatus used in the polishing and considered to have contacted the specified location.

3. The method of evaluating according to claim 1, wherein the representative lifetime measurement value is a median obtained from the multiple lifetime measurement values for the silicon wafer.

4. The method of evaluating according to claim 3, wherein the lifetime measurement determination threshold is a value obtained on the basis of a maximum value of the medians of the silicon wafers included in the wafer group.

5. A silicon wafer manufacturing method, which comprises:
   mass-producing silicon wafers in a silicon wafer manufacturing process for mass-producing multiple silicon wafers, wherein the silicon wafer manufacturing process for mass-producing multiple silicon wafers comprises polishing each silicon wafer to be mass-produced, wherein during the polishing, among two surfaces of each silicon wafer, one of the surfaces is polished and the other surface is held by chucks of a silicon wafer polishing apparatus;
   evaluating the manufacturing process by an evaluating method; and
   further mass-producing silicon wafers in the manufacturing process when it is determined that the manufacturing process allows a non-defective product to be produced as a result of the evaluation; or
   further mass-producing silicon wafers in the manufacturing process after performing process maintenance work when it is determined that the manufacturing process may cause a defective product to be produced as a result of the evaluation,
   wherein the evaluating method is a method of evaluating the silicon wafer manufacturing process for mass-producing multiple silicon wafers, which comprises:
      forming an oxide film by thermal oxidation on the surface held by the chucks during the polishing;
      performing lifetime measurement on the surface of the oxide film of the silicon wafers mass-produced in the silicon wafer manufacturing process in different locations within the surface of the oxide film of each of the mass-produced silicon wafers and obtaining multiple lifetime measurement values for each of the mass-produced silicon wafers;
      determining a representative lifetime measurement value for each of the mass-produced silicon wafers from the multiple lifetime measurement values obtained for that wafer;
      obtaining, for a wafer group containing a plurality of the mass-produced silicon wafers, a lifetime measurement determination threshold using the lifetime measurement representative value determined for each of the mass-produced silicon wafers included in the wafer group;
      determining whether the wafer group comprises a silicon wafer having a lifetime outlier determined on the basis of the lifetime measurement determination threshold obtained for the wafer group among the multiple measurement values obtained for each of the silicon wafers in the wafer group; and
      determining that:
         when no silicon wafer having the lifetime outlier is included in the wafer group, the manufacturing process allows a non-defective product to be produced;
         when a silicon wafer having the lifetime outlier is included in the wafer group, the manufacturing process may cause a defective product to be produced,
      the evaluating method further comprises determining that a cause of a defective product is included in the polishing when it is determined that the manufacturing process may cause a defective product to be produced.

6. The silicon wafer manufacturing method according to claim 5,
 wherein the evaluating method comprises specifying a location with a lifetime outlier for the silicon wafer including the lifetime outlier, and
 further comprises determining, as a cause of a defective product, the chucks included in the polishing apparatus used in the polishing and considered to have contacted the specified location.

7. The silicon wafer manufacturing method according to claim 5, wherein the representative lifetime measurement value is a median obtained from the multiple measurement values for each of the silicon wafers.

8. The silicon wafer manufacturing method according to claim 7, wherein the lifetime measurement determination threshold is a value obtained on the basis of a maximum value of the medians of the silicon wafers included in the wafer group.

\* \* \* \* \*